United States Patent [19]

Karsmakers et al.

[11] 4,040,297
[45] Aug. 9, 1977

[54] PRESSURE TRANSDUCER

[75] Inventors: Mathijs Antonius Karsmakers; Gerardus Henricus Johannus Somers, both of Eindhoven, Netherlands

[73] Assignee: U.S. Philips Corporation, New York, N.Y.

[21] Appl. No.: 633,286

[22] Filed: Nov. 19, 1975

[30] Foreign Application Priority Data

Dec. 2, 1974  Netherlands .................. 7415668

[51] Int. Cl.² ............................. G01L 9/06
[52] U.S. Cl. .................... 73/398 AR; 73/88.5 SD; 73/406; 338/4; 338/42
[58] Field of Search .......... 73/398 AR, 406, 88.5 SD; 338/4, 42, 5

[56] References Cited

U.S. PATENT DOCUMENTS

| 3,457,536 | 7/1969 | Dean et al. | 338/4 |
| 3,513,430 | 5/1970 | Heller | 73/88.5 SD |
| 3,520,191 | 7/1970 | Pien | 73/398 AR |
| 3,568,124 | 3/1971 | Sonderegger | 73/398 AR |
| 3,697,917 | 10/1972 | Orth et al. | 73/398 AR |
| 3,800,264 | 3/1974 | Kurtz et al. | 73/88.5 SD |
| 3,817,107 | 6/1974 | Shimada et al. | 73/398 AR |
| 3,916,365 | 10/1975 | Giachino | 338/5 |

FOREIGN PATENT DOCUMENTS

| 1,248,087 | 9/1971 | United Kingdom | 73/398 AR |

Primary Examiner—Donald O. Woodiel
Attorney, Agent, or Firm—Frank R. Trifari; David R. Treacy

[57] ABSTRACT

A pressure transducer for measuring pressure in a fluid, comprising a pressure-sensitive element which is formed from semiconductor material and bonded over a bore in an insulating holder, through which bore fluid to be measured is passed; and a sealed cap through which connection conductors are led.

2 Claims, 2 Drawing Figures

PRESSURE TRANSDUCER

The invention relates to a pressure tranducer for measuring the pressure in a fluid, in which a pressure-sensitive element for converting mechanical stresses into electric signals is incorporated in an envelope, which element is formed from semiconductor material and comprises a diaphragm in which pressure-sensitive resistors are provided, the element having a thickened edge with which it is secured in the envelope.

Such a pressure measuring device is described in Netherlands patent application 6817089 and the corresponding U.S. application, Ser. No. 879,171, filed Nov. 24, 1969 and assigned to the assignee of the instant application, and now abandoned; this known gauge is particularly suitable for measuring blood pressure in a blood vessel. However, for other applications a suitable envelope will have to be found. For example, when measuring the inlet air for a combustion engine a rigid construction will be necessary, assembly dismantling should be simple, long-lasting operation in unfavorable conditions should be ensured and, for accurate measurement of absolute pressures, a vacuum must prevail on one side of the diaphragm.

It is the object of the invention to provide a pressure transducer which fulfils the above-mentioned requirements. For that purpose, according to the invention, the pressure gauge is characterized in that the envelope is formed from a frame member which has a bore in its longitudinal directions that an insulating holder which also has a bore is secured to the upper face of the frame member, the pressure-sensitive element being secured to the insulating holder at the area of the bore, that a substrate having elements which constitute an electric amplifier circuit is present on the holder, said circuit being connected to the pressure-sensitive resistors in the diaphragm, a cap sealing the envelop through which cap connection conductors are led which are in contact with contact places on the substrate.

By taking up the electric amplifier circuit in the envelope, a compact assembly is obtained and the amplifier circuit is excellently protected from external influences, so that reliable long-lasting operation is ensured. The pressure gauge according to the invention is extremely suitable for use in unfavorable circumstances.

In a preferred embodiment according to the invention the holder is secured to an annular supporting member by means of a hermetic seal, and supporting member having a bore and being hermetically sealed to the heat portion of a screwbolt serving as the frame member. In this case the annular supporting member serves as a partition between the vacuum and the supply bore for the fluid. Said annular supporting member has a good resistance against mechanical and thermal loads so that the durability of the hermetic seals is particularly great.

In a further embodiment according to the invention the insulating holder consists of a hard glass and the connection of the pressure-sensitive element to the holder is formed by an aluminum ring which is secured to the two parts by means of thermocompression.

The hard glass has substantially the same coefficient of expansion as the pressure-sensitive element, so that a durable seal which is resistent against thermal load is possible. The thermocompression bond to the aluminum ring has proved to be extremely suitable for the connection of the pressure-sensitive element to the holder.

A further embodiment of the invention is characterized in that on the side of the pressure-sensitive element remote from the insulating holder a lid is secured, a space being present between the lid and the pressure-sensitive element in which space a vacuum is maintained by the lid. Considerably less stringent requirements need be imposed upon the connection of the further elements, while the accuracy of measurement does not decrease. The lid may advantageously be secured to the pressure-sensitive element by an aluminium ring secured to the two parts by thermocompression.

A suitable electric connection is obtained if the connection conductors are connected to contact places on the substrate via resilient elements.

The invention will be described in detail with reference to embodiments shown in the drawing.

Figure 1:
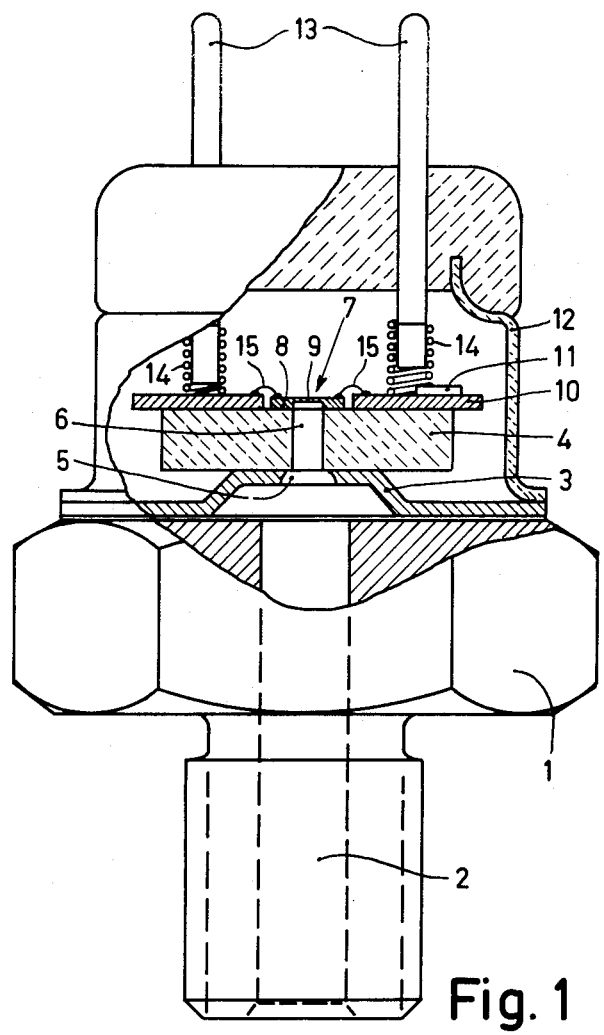
FIG. 1 is a side view partly in section of a pressure transducer embodiment which is suitable for measuring the inlet air of a combustion engine.

FIG. 1 shows a pressure transducer which can be secured by using a screwbolt 1. The screwbolt has a longitudinal bore 2 which during operation communicates with a fluid the pressure of which is to be determined. An annular supporting member 3 is secured to the head of the screwbolt by means of welding the two parts forming a frame assembly. The supporting member 3 consists, for example of invar, a nickel-iron alloy. An insulating holder 4 of hard glass, for example, borosilicate glass having a coefficient of thermal expansion corresponding to that of silicon, is soldered to the supporting member 3. Both the supporting member 3 and the holder 4 have bores 5 and 6, respectively.

A pressure-sensitive element 7 is secured to the insulating holder 4. The pressure-sensitive element consists of a semiconductor material, for example silicon; it has a thickened edge 8 and a thin diaphragm 9. Pressure-sensitive resistors are provided in the diaphragm 9, for example, by diffusion of implantation of an impurity. The resistors are preferably connected according to a Wheatstone bridge; upon deformation of the diaphragm an electric signal is obtained via the resistors.

The pressure-sensitive element 7 is connected to the thickened edge 8 on the holder 4. It has proved to be particularly favourable to form this connection by the interposition of an aluminum ring which is thermocompression bonded to the two parts. Such a connection proves to be a very readily vacuum-tight and extremely resistant against thermal load to which the choice of a holder 4 of hard glass contributes favourably.

Furthermore, an insulating substrate 10 is soldered to the insulating holder 4 and an electronic circuit is provided on the substrate 10, for example, in hybrid technique, an integrated amplifier 11 forms parts of the circuit. The resistors in the diaphragm 9 are connected to the electronic circuit by means of wires 15. The circuit may include operational amplifiers which convert the output voltage of the resistors in the diaphragm 9 connected in a Wheatstone bridge into a proportional current.

A cap 12 constitutes the seal of the envelope. The cap 12 is welded to the end face of the screwbolt 1; there is a vacuum in the cap so that measurement of absolute pressures become possible. By way of example, the cap 12 is formed on its upper wall of glass through which electric connection conductors 13 are led through. The conductors 13 each comprise a spring 14 which is connected to a contact place of the circuit on the substrate 10.

The pressure gauge described is extremely suitable as a means in controlling the correct air supply to combustion engines, in which an optimum cumbustion produces high efficiency and checks air pollution. The construction is resistant to thermal and mechanical loads, the vacuum is maintained for a long time. The electronic circuit arranged in the envelope is in a vacuum and will consequently have a favourable effect and a long life.

Figure 2:
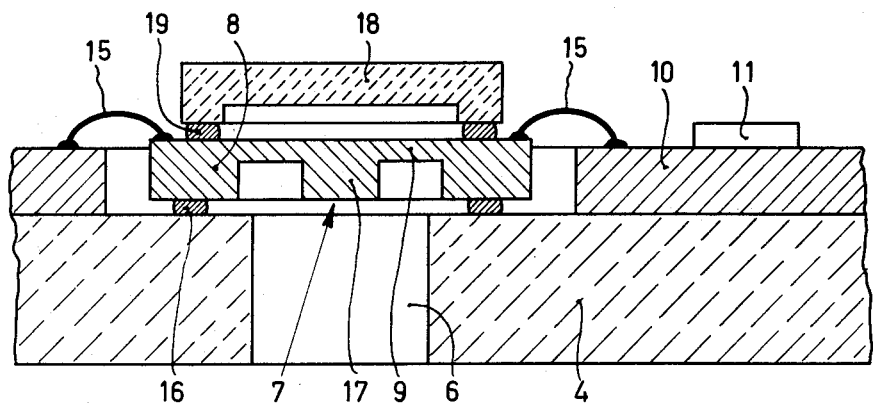
FIG. 2 is a cross-section detail of another embodiment.

It will be obvious that variations in the construction of the pressure gauge are possible without departing from the scope of this invention. For example, besides hard glass, the holder 4 may consist of a different insulating material; however, hard glass has proved to be particualrly favorable. The holder may also be secured directly to the head of the screwbolt 1; the use of a supporting member 3 of the shape as shown or of a different shape, however, is advantageous for a good hermetic seal. Furthermore, the use of the springs 14 is not necessary and further detail differences are also possible, FIG. 2 shows on a larger scale a detail of a further embodiment; in this embodiment, a vacuum need not prevail in the whole sealing cap, which reduces the requirements imposed upon the connections between the parts of the pressure gauge. The pressure-sensitive element 7 is secured to the insulating holder 4 which consists again preferably of a borosilicate glass. For that purpose, the thickened edge 8 is secured to the holder 4 with the interposition of an aluminum ring 16 by means of thermocompression. The diaphragm 9 has a thickened central portion 17 so that a particularly good linearity between the deformation of the resistors present in the diaphram and the output voltage of the resistors is obtained. An insulating layer of, for example silicon dioxide (not shown) is present on the upper side of the pressure-sensitive element. Secured to the pressure-sensitive element is a lid 18; a vacuum prevails in the space between the lid-shaped member 18 and the pressure-sensitive element. The joint between said two parts consists preferably of an aluminium ring 19, the sealing being effected by means of thermocompression. This embodiment enables in a simple manner the measurement of absolute pressures due to the presence of the vacuum space immediately above the diaphragm 9.

What is claimed is:

1. A pressure transducer for measuring pressure in a fluid, comprising an insulating holder having a bore therethrough, said bore having a supply end and a measuring end; means for mounting the insulating holder for communicating between said supply end of the bore and a fluid to be measured, comprising a mounting frame assembly having a through bore communicating with said supply end, and a sealing cap hermetically fastened to said frame and having electrical connections passing therethrough; and a pressure sensitive element bonded to the insulating holder and enclosing said measuring end of the bore, said element comprising a semiconductor material formed as a diaphragm having a thickened edge; wherein said insulating holder consists of a hard glass, and wherein said pressure sensitive element is bonded to the holder by thermocompression bonds to an aluminum ring between the holder and the pressure sensitive element.

2. A pressure transducer for measuring pressure in a fluid, comprising an insulating holder having a bore therethrough, said bore having a supply end and a measuring end; means for mounting the insulating holder for communication between said supply end of the bore and a fluid to be measured; and a pressure sensitive element bonded to the insulating holder and enclosing said measuring end of the bore; wherein said element comprises a semiconductor material formed as a diaphragm having a thickened edge, and said transducer further comprises an aluminum ring and a lid hermetically sealed to a side of said element remote from said bore by thermocompression bonds to said ring between the lid and the thickened edge.

* * * * *